(12) United States Patent
Yoo et al.

(10) Patent No.: US 8,586,453 B2
(45) Date of Patent: Nov. 19, 2013

(54) METHODS FOR FABRICATING THIN FILM PATTERN AND ARRAY SUBSTRATE

(75) Inventors: Seongyeol Yoo, Beijing (CN); Youngsuk Song, Beijing (CN); Seungjin Choi, Beijing (CN); Zhanfeng Cao, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 153 days.

(21) Appl. No.: 13/248,908

(22) Filed: Sep. 29, 2011

(65) Prior Publication Data

US 2012/0094472 A1 Apr. 19, 2012

(30) Foreign Application Priority Data

Oct. 14, 2010 (CN) .......................... 2010 1 0512170

(51) Int. Cl.
*H01L 21/20* (2006.01)
*H01L 21/36* (2006.01)

(52) U.S. Cl.
USPC ...................... 438/478; 257/E21.09; 349/34

(58) Field of Classification Search
USPC .................. 438/34, 478; 349/34; 257/E21.09
See application file for complete search history.

(56) References Cited

U.S. PATENT DOCUMENTS

| 2008/0009138 | A1* | 1/2008 | Lee ............................... 438/703 |
| 2010/0123130 | A1 | 5/2010 | Akimoto et al. |
| 2011/0273639 | A1* | 11/2011 | Xie et al. ......................... 349/43 |
| 2011/0299004 | A1* | 12/2011 | Liu et al. .......................... 349/44 |

FOREIGN PATENT DOCUMENTS

CN 1553267 A 12/2004

* cited by examiner

*Primary Examiner* — Phuc Dang
(74) *Attorney, Agent, or Firm* — Ladas & Parry LLP

(57) ABSTRACT

A method for fabricating a thin film pattern and a method for fabricating an array substrate are provided. The method for fabricating a thin film pattern comprises: forming a first film and a second film sequentially; applying a layer of photoresist on the second film; forming a photoresist pattern comprising a totally left region, a partially left region and a totally removed region; performing a first wet etching on the second film in the totally removed region; performing a first dry etching on the first film in the totally removed region to form a first pattern, and etching the photoresist layer to remove the photoresist in the partially left region to expose the second film in the partially left region; performing a second wet etching on the second film in the partially left region; performing a second dry etching to form a second pattern; and removing the residual photoresist.

12 Claims, 5 Drawing Sheets

METHODS FOR FABRICATING THIN FILM PATTERN AND ARRAY SUBSTRATE

BACKGROUND

Embodiments of the disclosed technology relate to a method for fabricating a thin film pattern and an array substrate.

A liquid crystal display (LCD) is a kind of flat display device which is mostly adopted at present. Thin film transistor liquid crystal displays (TFT-LCDs) are a kind of dominating products in the LCD market. The liquid crystal panel in a liquid crystal display device comprises an array substrate and a color filter substrate. The array substrate is typically configured to comprise data lines and gate lines intersecting with each other so as to form pixel units arranged in a matrix. Each of the pixel units is provided with a pixel electrode and a TFT switch element particularly comprising a gate electrode, an active layer, a source electrode and a drain electrode. The active layer generally comprises an amorphous silicon layer and an impurity-doped amorphous silicon layer. The source electrode and the drain electrode are located on the impurity-doped amorphous silicon layer of the active layer and the impurity-doped amorphous silicon layer between the source electrode and the drain electrode is etched to form a channel.

In a conventional four-mask patterning process for manufacturing an array substrate, patterns of the active layers, the source electrodes, the drain electrodes and the data lines are formed in one patterning process with a double tone mask. For meeting requirements of a large-sized liquid crystal panel in electric conducting, data lines would be better fabricated by a metal material having better electric conductive characteristics, such as one layer or layers of Aluminum (Al), Al alloy such as AlNd, Molybdenum (Mo), Mo/Al, Mo/AlNd, Mo/Al or Al alloy/Mo, Copper (Cu). Titanium (Ti), Ti/Al (AlNd)/Ti, Cu/Mo or Mo alloy. When one of these metal materials is elected, a method comprising one process of photolithography, two processes of wet etching, two processes of dry etching and two processes of ashing for removing photoresist are required to form data lines, and typical processes are as shown in FIGS. 1A to 1F.

Firstly, a semiconductor film 10, an impurity-doped semiconductor film 20 and a data line metal film 30 (other films not directly related to the process are not shown) are sequentially deposited on a base substrate 1 or other layers on the base substrate 1. Then, a photoresist layer 40 is applied onto the data line metal film 30, and the photoresist layer 40 is exposed and developed with a double tone mask, so as to form patterns comprising a totally left region, a partially left region and a totally removed region. The partially left region of the photoresist layer 40 has a thickness less than that of the totally left region. The totally left region corresponds to the positions of the data lines, the source electrodes and the drain electrodes, and the partially left region corresponds to the channels. As shown in FIG. 1A, in the region which corresponds to the positions of the data lines, after exposure and development, the totally left region of the photoresist layer 40 is formed thereon with the totally removed region located on its both sides.

Subsequently, a first wet etching is performed. That is, the data line metal film 30 located in the totally removed region of the photoresist is etched with a suitable etchant. Both sides of the data line metal film 30 are etched to be recessed with respect to the photoresist layer 40 due to the anisotropy of the etching, as shown in FIG. 1B.

Next, a first dry etching is performed. That is, the semiconductor film 10 and the impurity-doped semiconductor film 20 of the active layer located in the totally removed region are etched, as shown in FIG. 1C.

Then, an ashing process is performed so as to remove the photoresist layer 40 by a certain thickness. As a result, the photoresist layer 40 located in the partially left region is removed, and the photoresist layer 40 located in the totally left region is reduced in thickness by a certain amount. During the ashing, the photoresist layer 40 is reduced not only in the thickness direction, but also in its area due to ashing at the recessed portion of the metal film, as shown in FIG. 1D.

By a second wet etching, the data line metal film 30 in the partially left region is etched. Since both sides of the data lines are exposed, the recessed portion is further recessed, as shown in FIG. 1E.

By a second dry etching, the impurity-doped semiconductor film 20 in the partially left region is etched so as to form a channel of TFT. However, parts of the impurity-doped semiconductor film 20 located on both sides of the data lines are also exposed due to the previous ashing of the photoresist layer 40, and then are etched, as shown in FIG. 1F. On both sides of the data lines, there is remained a part of active layer, i.e., remained a part of the semiconductor film 10, with a certain thickness beyond the data lines.

The data line pattern formed through the above etching processes is shown in FIG. 1F. There are undesired portions of the active layer extending beyond both sides of the data line pattern, which results in critical dimension bias (CD bias). Therefore, the line width of the data lines is determined by the width of the remained active layer in fact. Since the metal film pattern for electric conducting practically is relatively narrow, the data lines are subject to decreased capability of electric conducting due to high-resistance. Since the capability of transmitting current of the data lines decreases, a signal transmission delay will occur with the display effect being affected disadvantageously. The design of the bonding region around the pixel region is also affected significantly and the data lines extending to the bonding region are arranged densely to connect drive lines. The amorphous silicon film on both sides of the data lines has an increased line width, so the area of the bonding region is increased correspondingly. Generally, the producers have to deal with this problem by reducing the pixel region.

Since the wet etching for the metal film can results in a recessed portion on both sides due to over-etching, and then results in the ashing of the photoresist above the recessed portion. In this case, semiconductor films are left on both sides of the data lines. However, if the metal film is etched by a dry etching process, the problems such as process complexity, corrosion and increased product cost will arise. The above problems present not only in the process for fabricating the array substrate, but also in any processes for wet etching and dry etching different films sequentially with a double tone mask.

SUMMARY

According to a first aspect of the disclosed technology, a method for fabricating a thin film pattern is provided. The method for fabricating a thin film pattern comprises: forming a first film and a second film on a substrate sequentially; applying a layer of photoresist on the second film; exposing and developing the photoresist layer with a double tone mask to form a photoresist pattern comprising a totally left region, a partially left region and a totally removed region; performing a first wet etching on the second film in the totally removed region; performing a first dry etching on the first film in the totally removed region to form a first pattern, and etching the photoresist layer to remove the photoresist in the partially left region and reduce the photoresist of the totally left region in thickness, so as to expose the second film in the partially left region; performing a second wet etching on the second film in the partially left region; performing a second dry etching for etching entire or a part of the first film in the partially left region to form a second pattern; and removing the residual photoresist.

According to a second aspect of the disclosed technology, a method for fabricating an array substrate is provided. The method comprises steps for forming patterns of data lines, active layers, source electrodes and drain electrodes. The steps for forming patterns of data lines, active layers, source electrodes and drain electrodes comprises forming an active layer film and a data line metal film on a substrate sequentially; applying a layer of photoresist on the data line metal film; exposing and developing the photoresist layer with a double tone mask to form a photoresist pattern comprising a totally left region, a partially left region and a totally removed region; performing a first wet etching on the data line metal film in the totally removed region; performing a first dry etching on the active layer film in the totally removed region to form the patterns of data lines, source electrodes, drain electrodes and active layers, and etching the photoresist layer to remove the photoresist in the partially left region and reduce the photoresist of the totally left region in thickness, so as to expose the data line metal film in the partially left region; performing a second wet etching on the data line metal film in the partially left region; performing a second dry etching for etching entire or a part of the active layer film in the partially left region to form a channel pattern on the active layer; and removing the residual photoresist.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

Figure 1A:
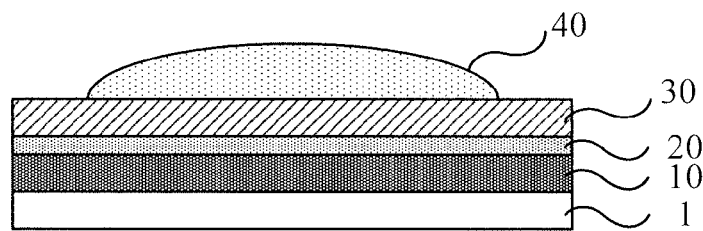
FIGS. 1A to 1F are side-view cross section structural schematic diagrams showing processes for fabricating data lines in prior art.
Figure 1B:
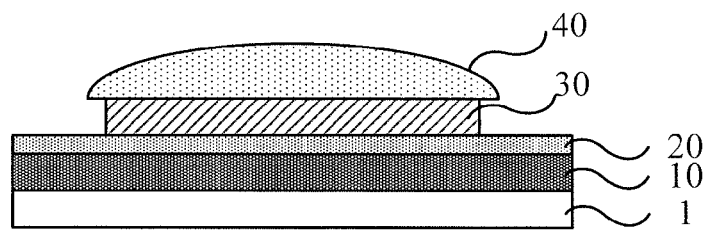
Figure 1C:
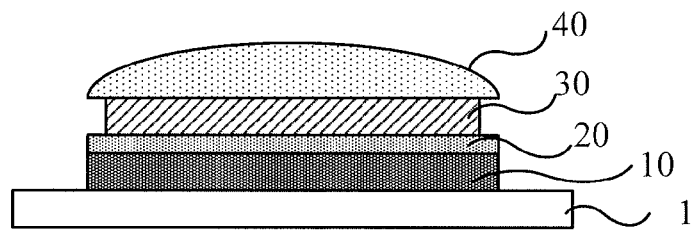
Figure 1D:
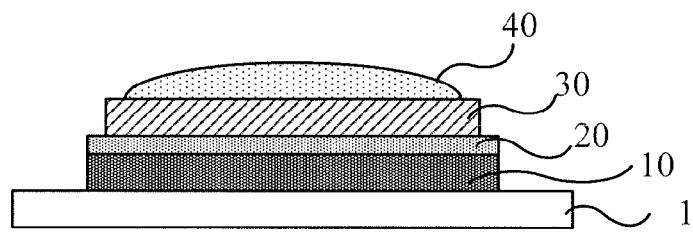
Figure 1E:
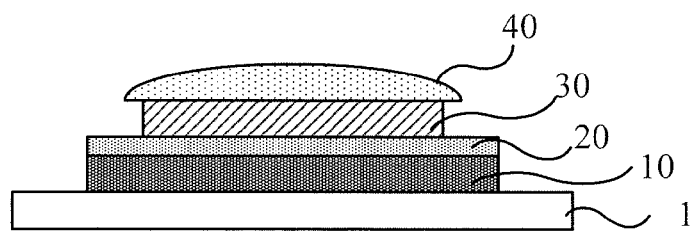
Figure 1F:
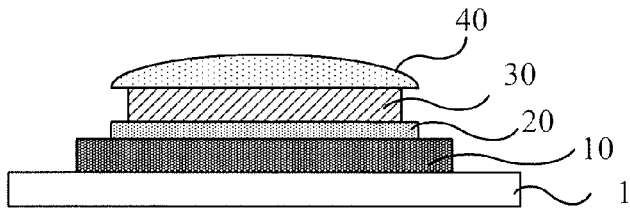

Hereinafter, the embodiments of the disclosed technology will be described in detail with reference to the accompanying drawings so that the objects, technical solutions and advantages of the embodiments of the disclosed technology will become more apparent. It should be noted that the embodiments described below merely are a portion of but not all of the embodiments of the disclosed technology, and thus various modifications, combinations and alterations may be made on basis of the described embodiments without departing from the spirit and scope of the disclosed technology.

An embodiment of the disclosed technology provides a method for fabricating a thin film pattern, comprising the following steps: forming a first film and a second film on a substrate sequentially; applying a layer of photoresist on the second film; exposing and developing the photoresist layer with a double tone mask to form a photoresist pattern comprising a totally left region, a partially left region and a totally removed region; performing a first wet etching on the second film in the totally removed region; performing a first dry etching on the first film in the totally removed region to form a first pattern, and etching the photoresist layer to remove the photoresist in the partially left region and reduce the photoresist of the totally left region in thickness; performing a second wet etching on the second film in the partially left region; performing a second dry etching for etching entire or a part of the first film in the partially left region to form a second pattern; and removing the residual photoresist.

In design, the totally left region may have an area beyond that of the first pattern to be formed, so that the time of etching the photoresist is almost equal to the time of the first dry etching on the first film in the first dry etching.

In the above technical solution, since the first dry etching of the first film and the ashing of the photoresist are performed simultaneously, the width of the first film pattern formed after this step is equal to the width of the photoresist pattern after ashing. In this way, the line width after patterning in the photolithograph process with a double tone mask can be reduced, and the phenomena of remaining first film can be avoided. The above technical solution can be applied to process for fabricating various thin film patterns, and the above method can be applied to form the patterns correspondingly as long as wet etching and dry etching are performed sequentially in the processes.

As to the typical material of thin films to be wet-etched and dry-etched, the first film may comprise a semiconductor material and the second film may comprise a metal material. The process for performing the first dry etching may comprise: $SF_6$, $O_2$, He and $CF_4$ as well as $Cl_2$ or HCl are used as reactive gases to perform the first dry etching. As to the gases and the process parameters, the volume flow rate of $SF_6$ is 30 to 500 sccm, the volume flow rate of $O_2$ is 500 to 3000 sccm, the volume flow rate of He is 100 to 1000 sccm, the volume flow rate of CF4 is 40 to 500 sccm, and the volume flow rate of $Cl_2$ or HCl is 100 to 2000 sccm. The reactive conditions of the first dry etching comprise a vacuum degree of 50 to 1000 mTorr, a RF power is 500 W to 7000 W, and a temperature of 23☐ to 150☐.

The embodiment of the disclosed technology provides a method for fabricating an array substrate, in which the method for fabricating a thin film pattern is adopted. Specifically, the first film is the active layer film and the fabricated pattern comprises the active layer with a defined channel, the second film is the data line metal film and the fabricated pattern comprises the data lines, the source electrodes and the drain electrodes. The detailed description is given below for example.

Figure 2:
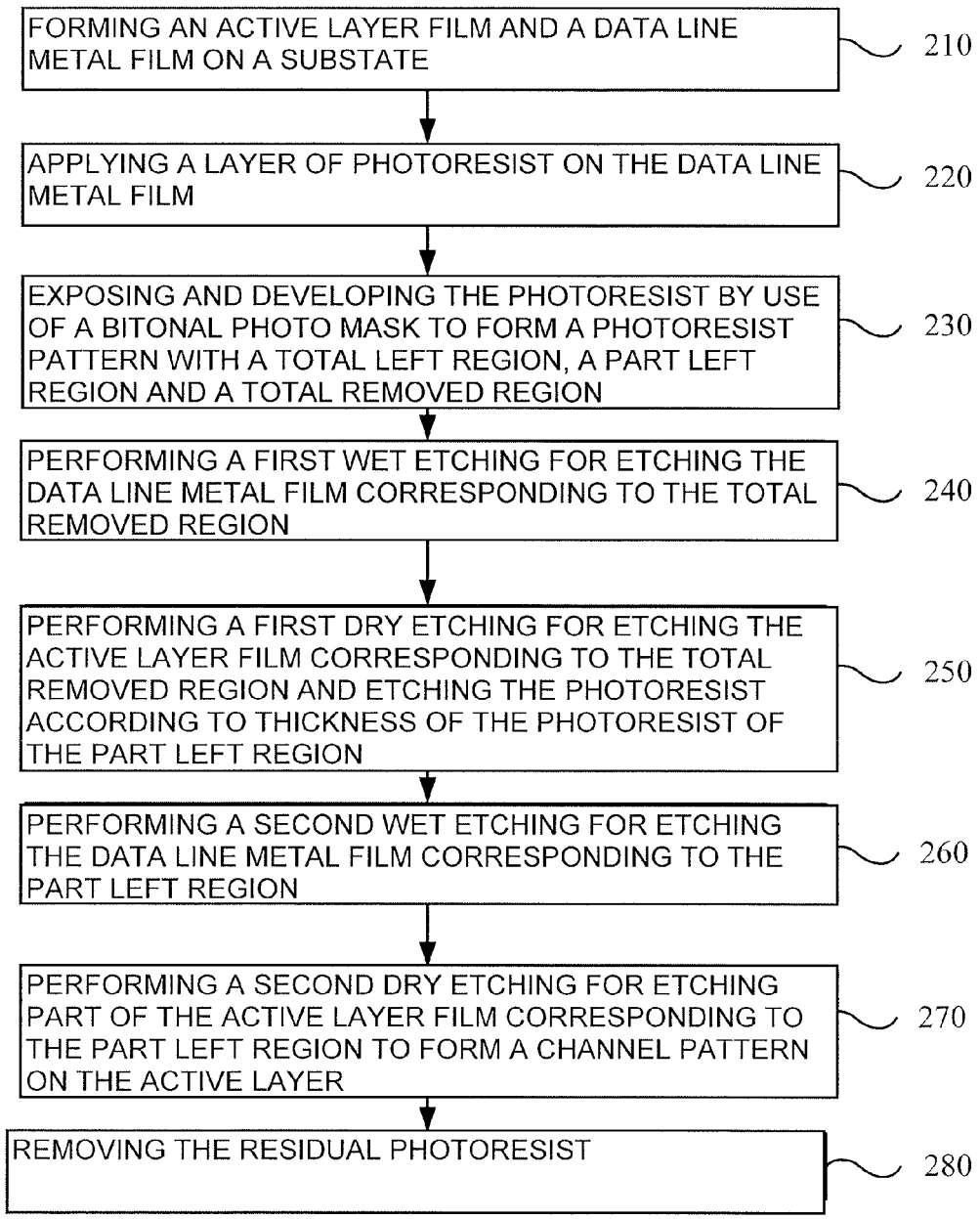
FIG. 2 is a partial flow diagram showing a method for fabricating an array substrate according to an embodiment of the disclosed technology.

FIG. 2 is a partial flow diagram showing a method for fabricating an array substrate according to the embodiment of the disclosed technology. The method for fabricating the array substrate may comprise at least steps of forming data lines, an active layer, source electrodes and drain electrodes. Other patterns formed on the array substrate and corresponding steps can be designed according to requirements, while the steps of forming data lines, an active layer, source electrodes and drain electrodes, as shown in FIG. 2, may comprise the processes as follows.

In the step 210, the active layer films and the data line metal film 30 are formed in order on the base substrate 1.

The active layer films and the data line metal film 30 can be formed directly on the base substrate 1 or on the other patterns formed on the base substrate 1. The active layer films generally comprise laminated layers of a semiconductor film 10 and an impurity-doped semiconductor film 20. The data line metal film 30 may be a single layer or laminated layers of metal materials, such as Aluminum (Al), Al alloy, Molybdenum (Mo), Mo/Al, Mo/AlNd, Mo/Al or Al alloy/Mo, Copper (Cu), Titanium (Ti), Ti/Al (AlNd)/Ti, Cu/Mo or Mo alloy, preferably Al or Al alloy and Nd with a low resistance.

In the step 220, a photoresist layer 40 is applied to the data line metal film 30.

Figure 3A:
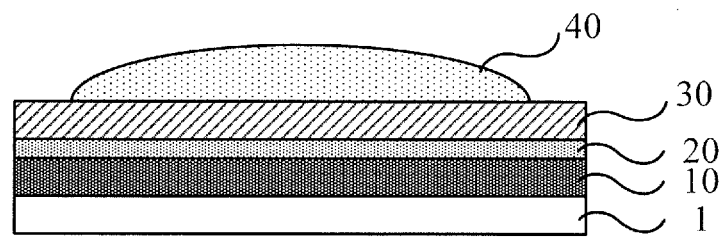
FIGS. 3A to 3E are side-view cross section structural schematic diagrams showing processes for fabricating data lines according to the embodiment of the disclosed technology.

In the step 230, the photoresist layer 40 is exposed and developed with a double tone mask, so as to form patterns comprising a totally left region, a partially left region and a totally removed region of the photoresist, as shown in FIG. 3A. The pattern at the position of one data line is shown in FIG. 3A, but other pattern is not shown for simplicity. The data line is located in the totally left region with the totally removed region being located on both sides.

Figure 3B:
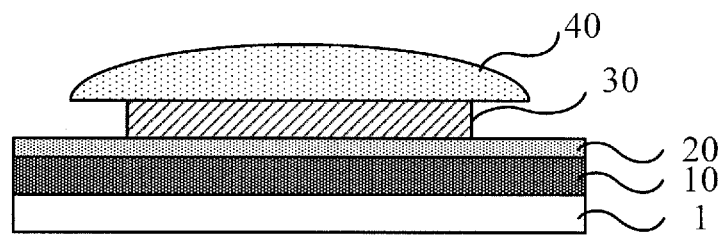

In the step 240, the first wet etching is performed. The data line metal film 30 corresponding to the totally removed region is etched, as shown in FIG. 3B.

Figure 3C:
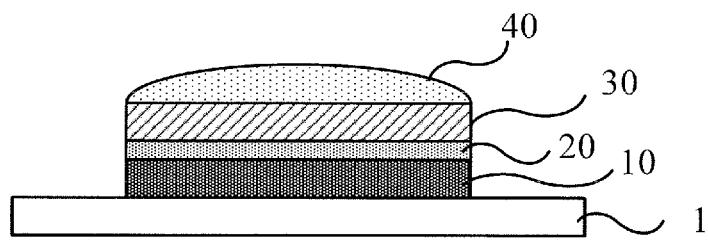

In the step of 250, the first dry etching is performed. The active layer films, specifically the impurity-doped semiconductor film 20 and the semiconductor film 10 corresponding to the totally removed region are etched so as to form patterns of the data lines, the source electrodes, the drain electrodes and the active layer. At the same time, the photoresist layer 40 is etched to remove the partially left region of the photoresist layer 40, and reduce the totally left region of the photoresist layer 40 in thickness, as shown in FIG. 3C.

In this step, since the active layer films and the photoresist layer 40 are etched simultaneously, in order to avoid to reduce over-etching on the photoresist layer 40 due to long etching time required by the active layer films, a relatively wide totally left region can be formed upon forming the totally left region, so that the time for etching the photoresist layer 40 is almost equal to the time for etching the active layer films. That is, the area of the totally left region is designed to be, by a certain amount, more than the area of the data lines, the source electrodes and the drain electrodes to be formed, which can be set according to actual etching conditions so that the time for etching the photoresist is almost equal to the time for first dry etching on the active layer films when the first dry etching is performed. The data line metal film 30 is over etched partially in the step of 240, and the predetermined data line width can be achieved by taking the over-etched size into account.

Figure 3D:
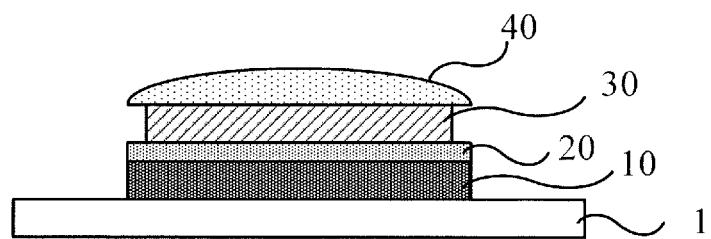

In the step of 260, the second wet etching is performed. The data line metal film 30 in the partially left region is etched, as shown in FIG. 3D.

Figure 3E:
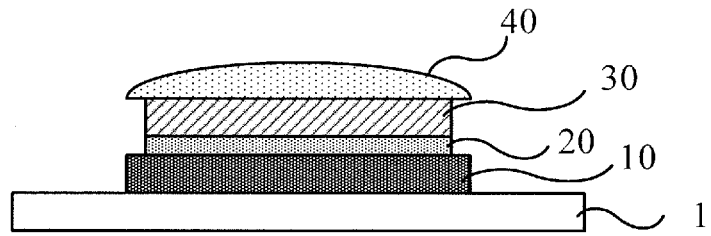

In the step of 270, the second dry etching is performed. Parts of the active layer corresponding to the partially left region are etched. In this embodiment, the impurity-doped semiconductor film 20 is etched, while the semiconductor film 10 is left. If the active layer is fabricated with a single kind material, the active layer film is etched by a certain thickness to as to form a channel pattern in the active layer, as shown in FIG. 3E.

In the step of 280, the remained photoresist is removed.

In this embodiment, the first dry etching of the active layer films and the ashing of the photoresist are performed simultaneously in order to decrease the etching time and increase the product efficiency. More significantly, it is advantageous to decrease the residual amount of the active layer remained on both sides of the data lines so as to reduce the line width of the data lines. In the technology as shown in FIGS. 1A-1F, the first dry etching is performed firstly and then the ashing is performed to remove the photoresist, thus the active layer on both sides of the data lines has the same width as that of the totally left region of the photoresist so as to extend from the recessed data lines. In this embodiment, the first dry etching of the active layer films and the ashing of the photoresist are performed simultaneously, and the active layer on both sides of the data line has the same width as that of the photoresist after ashing and is narrower than the totally left region. Since the line width of the data lines is determined by the width of the active layer film below the data line film, the less width of the active layer film below of the data line will result in the less width of the data line.

Figure 4A:
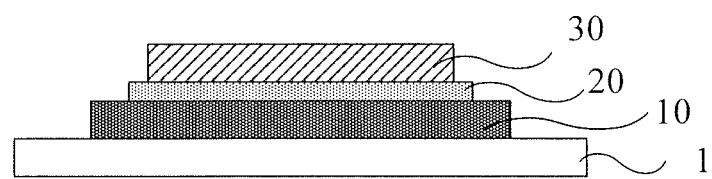
FIG. 4A is a schematic diagram showing a side-view cross section structure of the data lines fabricated according to a conventional method.
Figure 4B:
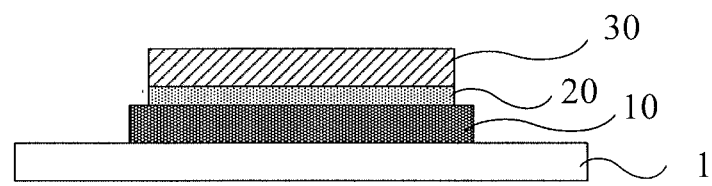
FIG. 4B is a schematic diagram showing a side-view cross section structure of the data lines fabricated according to the embodiment of the disclosed technology.

FIG. 4A is a cross-sectional view of the data lines fabricated according to a conventional method, and FIG. 4B is a cross-sectional view of the data lines fabricated according to an embodiment of the disclosed technology. The data lines of a metal material formed in FIGS. 4A and 4B have the same width and thus have the same electrical conductance. However, the residual active layer film in FIG. 4B is relatively narrow, and the practical data line width is not increased.

The technical solution according to the embodiment of the disclosed technology is advantageous to increase an aperture ratio and the size of the pixel region, reduce the size of the bonding region and arrange the data line of the bonding region more densely.

By adopting the above technical solution, it is unnecessary to worry about the effect of the ashing amount of the photoresist with respect to the residual amount of the active layer on both sides of the data line. Therefore, the amount of the photoresist reduced by ashing can be increased properly, which can decrease the requirement of accuracy for controlling the ashing amount of the photoresist.

In this embodiment, the reactive gases for the first dry etching of the active layer and the ashing of the photoresist can be selected according to the practical requirements, such as sulfur hexafluoride ($SF_6$)/tetrafluoromethane ($CF_4$)/chlorine ($Cl_2$)/oxygen ($O_2$)/boron trichlorid ($BCl_3$)/helium (He)/hydrochloric acid (HCl)/nitrogen ($N_2$) and the like. Preferably, $O_2$, He, $CF_4$, and $Cl_2$ or HCl, or $SF_6$, $O_2$, He, and $Cl_2$ or HCl, can be selected as the reactive gases to perform the first dry etching. Preferably, the reactive gases for the source/drain etching can be selected as SF6/O2/He, or SF6/O2/He/HCl (or Cl2), or CF4/O2/He, or CF4/O2/He/HCl (or Cl2).

An example of the parameters and process conditions for the above reactive gases are as follows.

The volume flow rate of $SF_6$ is 30 to 500 sccm, the volume flow rate of $O_2$ is 500 to 3000 sccm, the volume flow rate of He is 100 to 1000 sccm, the volume flow rate of CF4 is 40 to 500 sccm, and the volume flow rate of $Cl_2$ or HCl is 100 to 2000 sccm. The first dry etching is performed under the following reactive conditions, comprising a vacuum degree of 50 to 100 mTorr, a RF power of 500 W to 7000 W, and a temperature of 23° C. to 150° C.

The properly controlling of the reactive conditions can avoid the effects of the over-etched gate insulating layer. For a typical array substrate configuration, the data lines, the source and the drain electrodes and the active layer is formed on the gate insulating layer. The etching gas of the active layer film may etch the gate insulating layer also. For example, the gases such as $SF_6$, $O_2$, He, and the like may etch SiNx for forming the gate insulating layer. Therefore, when the active layer film is etched, the gate insulating layer may be also over-etched. The gate insulating layer will become relative thinner due to over-etching. The gate insulating layer is generally the capacitor dielectric for forming the storage capacitor, thus the reduced gate insulating layer will result in the less capacitance of the storage capacitor, which exerts an influence on the driving characteristics of TFTs and the picture display quality. The preferable reactive condition given in this embodiment can decrease the over-etching of the gate insulating layer at much as possible.

In one or more of the embodiments of the disclosed technology, a more simple solution for fabricating the data lines, the active layer and the source and the drain electrodes is adopted, and the etching of the active layer film and the ashing of the photoresist are performed simultaneously in a one step manner, which can simplify the process and minimize the residual portion of the active layer so as to insure high quality LCD.

It should be appreciated that the embodiments described above are intended to illustrate but not limit the disclosed technology. Although the disclosed technology has been described in detail herein with reference to the preferred embodiments, it should be understood by those skilled in the art that the disclosed technology can be modified and some of the technical features can be equivalently substituted without departing from the spirit and scope of the disclosed technology.

What is claimed is:

1. A method for fabricating a thin film pattern, comprising:
   forming sequentially a first film and a second film on a substrate;
   applying a layer of photoresist on the second film;
   exposing and developing the photoresist layer with a double tone mask to form a photoresist pattern comprising a totally left region, a partially left region and a totally removed region;
   performing a first wet etching on the second film in the totally removed region;
   performing a first dry etching on the first film in the totally removed region to form a first pattern, and etching the photoresist layer to remove the photoresist in the partially left region and reduce the photoresist of the totally left region in thickness so as to expose the second film in the partially left region;
   performing a second wet etching on the second film in the partially left region;
   performing a second dry etching for etching entire or a part of the first film in the partially left region to form a second pattern; and
   removing the residual photoresist.

2. The method according to claim 1, wherein the first film comprises a semiconductor material and the second film comprises a metal material.

3. The method according to claim 1, wherein $SF_6$, $O_2$, He and $CF_4$ as well as $Cl_2$ or HCl are used as reactive gases to perform the first dry etching.

4. The method according to claim 3, wherein the volume flow rate of $SF_6$ is 30 to 500 sccm, the volume flow rate of $O_2$ is 500 to 3000 sccm, the volume flow rate of He is 100 to 1000 sccm, the volume flow rate of CF4 is 40 to 500 sccm, and the volume flow rate of $Cl_2$ or HCl is 100 to 2000 sccm; and
   the reactive conditions of the first dry etching comprise a vacuum degree of 50 to 1000 mTorr, a RF power is 500 W to 7000 W, and a temperature of 23° C. to 150° C.

5. The method according to claim 1, wherein the totally left region has an area beyond that of the first pattern to be formed, so that the time of etching the photoresist is equal to the time of the first dry etching on the first film when the first dry etching is performed.

6. A method for fabricating an array substrate, comprising forming patterns of data lines, active layers, source electrodes and drain electrodes, comprising:
   forming sequentially an active layer film and a data line metal film on a substrate;
   applying a layer of photoresist on the data line metal film;
   exposing and developing the photoresist layer with a double tone mask to form a photoresist pattern comprising a totally left region, a partially left region and a totally removed region;
   performing a first wet etching on the data line metal film in the totally removed region;
   performing a first dry etching on the active layer film in the totally removed region to form the patterns of data lines, source electrodes, drain electrodes and active layers, and etching the photoresist layer to remove the photoresist in the partially left region and reduce the photoresist of the totally left region in thickness, so as to expose the data line metal film in the partially left region;
   performing a second wet etching on the data line metal film in the partially left region;
   performing a second dry etching for etching entire or a part of the active layer film in the partially left region to form a channel pattern on the active layer; and
   removing the residual photoresist.

7. The method for fabricating an array substrate according to claim 6, wherein $SF_6$, $O_2$, He and $CF_4$ as well as $Cl_2$ or HCl are used as reactive gases to perform the first dry etching.

8. The method for fabricating an array substrate according to claim 7, wherein the volume flow rate of $SF_6$ is 30 to 500 sccm, the volume flow rate of $O_2$ is 500 to 3000 sccm, the volume flow rate of He is 100 to 1000 sccm, the volume flow rate of CF4 is 40 to 500 sccm, and the volume flow rate of $Cl_2$ or HCl is 100 to 2000 sccm; and
   the reactive conditions of the first dry etching comprise a vacuum degree of 50 to 1000 mTorr, a RF power is 500 W to 7000 W, and a temperature of 23° C. to 150° C.

9. The method for fabricating an array substrate according to claim 8, wherein the data line metal film is made of Aluminum (Al), Al alloy, Molybdenum (Mo), Mo/Al, Mo/AlNd, Mo/Al or Al alloy/Mo, Copper (Cu), Titanium (Ti), Ti/Al (AlNd)/Ti, Cu/Mo or Mo alloy.

10. The method for fabricating an array substrate according to claim 9, wherein the data line metal film is made of Al or Al alloy or Nd.

11. The method for fabricating an array substrate according to claim 8, wherein the active layer film comprises laminated layers a semiconductor film and an impurity-doped semiconductor film.

12. The method for fabricating an array substrate according to claim 6, wherein
   the totally left region has an area beyond that of the patterns of the data lines, the source electrodes and the source electrodes to be formed, so that the time of etching the photoresist is equal to the time of the first dry etching on the active layer film when the first dry etching is performed.

* * * * *